United States Patent [19]
Houlberg et al.

[11] Patent Number: 5,666,117
[45] Date of Patent: Sep. 9, 1997

[54] NON-RETURN TO ZERO LEVEL TO BI-PHASE SIGNAL CONVERTER

[75] Inventors: Christian L. Houlberg, Ventura; Lawrence N. Jue, Moorpark, both of Calif.

[73] Assignee: The United State of American as represented by the Secretary of the Navy, Washington, D.C.

[21] Appl. No.: 528,623

[22] Filed: Aug. 31, 1995

[51] Int. Cl.$^6$ .................................... H03M 5/12
[52] U.S. Cl. ............................... 341/70; 341/68
[58] Field of Search ...................... 341/68, 69, 70, 341/71

[56] References Cited

U.S. PATENT DOCUMENTS

| | | |
|---|---|---|
| 4,769,723 | 9/1988 | Tran .................................. 360/39 |
| 4,773,084 | 9/1988 | Scholz ................................ 341/68 |
| 4,905,257 | 2/1990 | Palkert et al. ..................... 341/70 |
| 5,305,321 | 4/1994 | Crayford .......................... 370/94.1 |

*Primary Examiner*—Marc S. Hoff
*Attorney, Agent, or Firm*—Melvin J. Sliwka; David S. Kalmbaugh

[57] ABSTRACT

A digital conversion circuit for receiving a Non-Return to Zero Level Data stream and then converting the Non-Return to Zero Level Data stream to a Bi-Phase Data stream. Combinational logic including an EXCLUSIVE-NOR circuit, three D-type Flip-Flops, AND gates, a NAND gate and inverters are utilized to convert the incoming Non-Return to Zero Level Data stream to the Bi-Phase Data stream while eliminating from the Bi-Phase Data stream any undesirable spikes or noise.

10 Claims, 1 Drawing Sheet

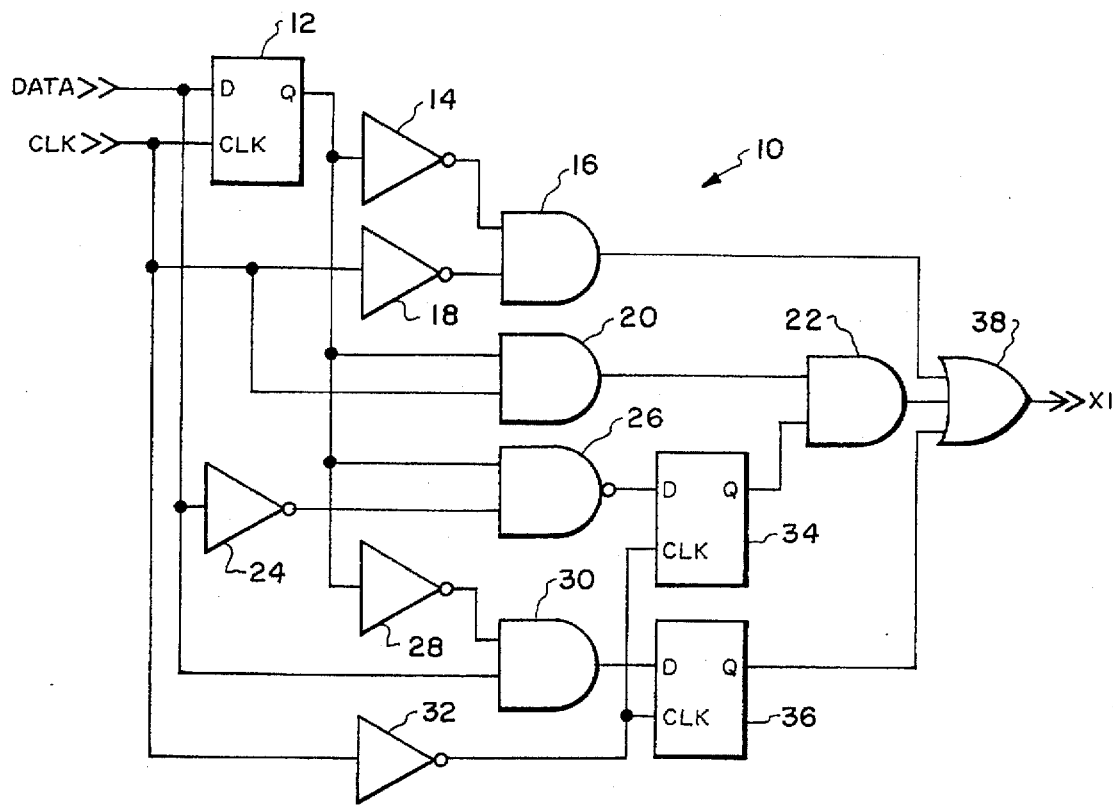
Fig. 1.
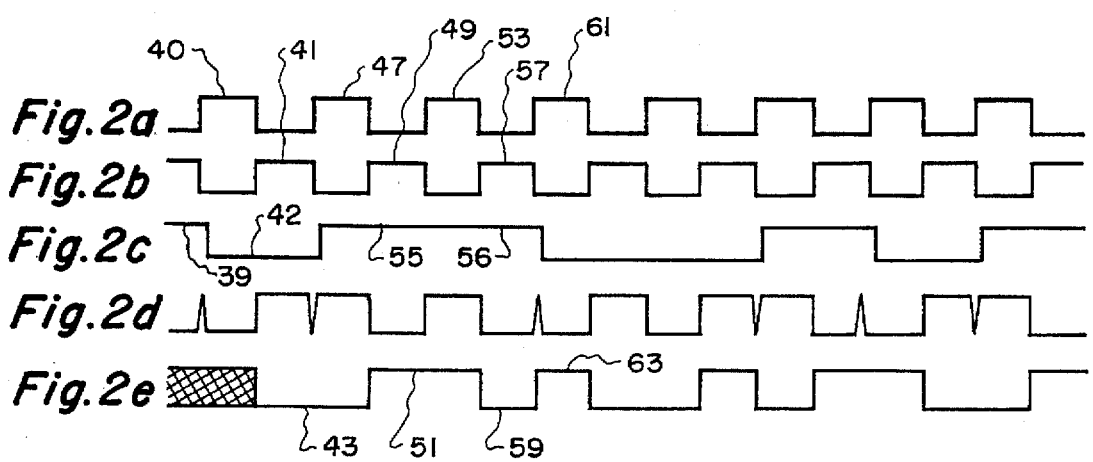
Fig. 2a.
Fig. 2b.
Fig. 2c.
Fig. 2d.
Fig. 2e.

NON-RETURN TO ZERO LEVEL TO BI-PHASE SIGNAL CONVERTER

BACKGROUND OF THE INVENTION

1. Field of the Invention The present invention relates generally to the conversion of electric signals. More specifically, the present invention relates to a signal conversion circuit for converting Non-Return to Zero Level Data to Bi-Phase Data.

2. Description of the Prior Art

Telemetry data transmitted from a missile to a ground station generally requires that the data be converted from a Non-Return to Zero Level (NRZ-L) data format to a Bi-Phase data format.

In the past this data conversion was performed by an EXCLUSIVE NOR circuit which converted incoming NRZ-L data to Bi-Phase data and which is defined by the following Boolean logic expression.

$$X_0 = \overline{CLK \oplus DATA} \tag{1}$$

where $X_0$ is the Bi-Phase output signal, CLK is the input clock signal and DATA is the incoming NRZ-L data. As is evident from FIG. 2D utilizing a conversion circuit defined by Expression (1) to convert incoming NRZ-L data to Bi-Phase data results in a waveform which includes undesirable spikes. These undesirable spikes occur whenever a data bit (illustrated in FIG. 2C) changes state from a logic one state to a logic zero state or from a logic zero state to a logic one state.

These undesirable spikes need to be eliminated which would require, for example, a filter circuit to be connected to the output $X_0$ of the circuit define by Expression (1). However, a filter circuit may not entirely eliminate spikes from the Bi-Phase data signal of FIG. 2D, resulting in noise in the Bi-Phase data signal of FIG. 2D.

It is also very desirable to eliminate spikes and unwanted noise when Non-Return to Zero Level (NRZ-L) to Bi-Phase data is used in conjunction with a frequency modulated (FM) recorder.

Accordingly, it is an object of the present invention to provide an improved signal conversion circuit for converting incoming NRZ-L data to Bi-Phase data.

It is another object of the present invention to provide a signal conversion circuit for eliminating undesirable spikes from NRZ-L data which is being converted to Bi-Phase data.

It is still another object of the present invention to provide a relatively simple in design, economical and highly efficient signal conversion circuit for eliminating undesirable spikes from NRZ-L data which is being converted to Bi-Phase data.

Various other advantages and novel features of the signal conversion circuit constituting the present invention will become apparent to those skilled in the art as a more detailed description of the present invention is set forth below.

SUMMARY OF THE INVENTION

A digital conversion circuit for receiving a Non-Return to Zero Level (NRZ-L) Data stream and then converting the Non-Return to Zero Level Data stream to a Bi-Phase Data stream. Combinational logic including an EXCLUSIVE-NOR circuit, three D-type Flip-Flops, AND gates, a NAND gate and inverters is utilized to convert the incoming Non-Return to Zero Level Data stream to the Bi-Phase Data stream while eliminating from the Bi-Phase Data stream any undesirable spikes or noise.

A first D-type Flip-Flop of the three D-type Flip-Flops stores each data bit of the NRZ-L data stream for one clock cycle of an externally generated clock signal. A detection circuit is provided within the digital conversion circuit to detect when a transition from a logic zero to a logic one or from logic one to logic zero occurs within the NRZ-L data stream. Each data bit at the input of the first D-type Flip-Flop is compared with the previous data bit which is now stored in the first D-type Flip-Flop by a NAND gate and an AND gate. When a transition of the logic state within the NRZ-L data stream occurs an inversion of the external clock will clock a logic bit which indicates the detection of the transition into either the second D-type Flip-Flop of the three D-type Flip-Flops or the third D-type Flip-Flop of the three D-type Flip-Flops. This logic bit is then used to prevent noise or a spike from passing through the conversion circuit while the EXCLUSIVE-NOR circuit is converting the Non-Return to Zero Level Data stream to the Bi-Phase Data stream.

BRIEF DESCRIPTION OF THE DRAWINGS

FIG. 1 is a detailed circuit diagram of the signal conversion circuit constituting the present invention; and FIGS. 2A–2E illustrate some of the clock and data signals occurring at the inputs and outputs of various components of the circuit of FIG. 1.

DETAILED DESCRIPTION OF THE PRESENT INVENTION

Referring first to FIG. 1 there is shown a signal conversion circuit for converting incoming Non-Return to Zero Level (NRZ-L) Data to Bi-Phase Data, designated generally by the reference numeral 10, which eliminates undesirable spikes or noise from the Bi-Phase data occurring at its $X_1$ output. Signal conversion circuit 10 includes a Flip-flop 12 which receives an externally generated clock signal (illustrated in FIG. 2A) having a frequency in a range from about 100 kilo-hertz to about one megahertz. It should be understood, however that the present is adapted to accommodate clock frequencies of up to ten megahertz.

Flip-Flip 12 also receives from an external source, such as a missile in flight, an NRZ-L data stream (illustrated in FIG. 2C) which it converts to Bi-Phase data. The rising edge of the first clock pulse 40 of the clock signal of FIG. 2A clocks data bit 39 (FIG. 2C) through Flip-Flop 12 to its Q output. This results in data bit 39 which is a logic one being supplied to inverters 14 and 28 and the first inputs of AND gate 20 and NAND gate 26.

When the data stream of FIG. 2C transitions to a logic zero state (data bit 42 of NRZ-L data stream of FIG. 2C), a logic zero is supplied to inverter 24 and the first input of AND gate 30. Inverter 14 inverts data bit 39 to a logic zero state disabling AND gate 16 which results in a logic zero being supplied to the first input of OR gate 38. Inverter 24 inverts data bit 42 resulting in a logic one at the second input of NAND gate 26 which then provides at its output a logic zero since the first input of NAND gate 26 is already at the logic one state, that is data bit 39 was previously provided to the first input of NAND gate 26. The logic zero at the output of NAND gate 26 is supplied to the D input of a Flip-Flop 34.

Data bit 39 is also inverted by inverter 28 resulting in a logic zero at the first input of AND gate 30 disabling AND gate 30 which, in turn, results in a logic zero being supplied to the D input of a Flip-Flop 36.

Inverters 18 and 32 each invert the clock signal of FIG. 2A resulting in the inverted clock signal of FIG. 2B being supplied to the first input of AND gate 16 and the clock inputs of Flip-Flops 34 and 36. The rising edge of clock pulse 41 (FIG. 2B) clocks the logic zero at the D input of Flip-Flop 34 to its Q output and the logic zero at the D input of Flip-Flop 34 to its Q output. The logic zero occurring at the Q output of Flip-Flop 34 is supplied to the first input of AND gate 22 disabling AND gate 22 which results in a logic zero being provided to the second input of OR gate 38. Similarly, the logic zero occurring at the Q output of Flip-Flop 36 is supplied to the third input of OR gate 36 results in a logic zero at the output of OR gate 38. This logic zero is data bit 43 of the Bi-Phase data stream of FIG. 2E.

At this time it should be noted that prior to the occurrence of clock pulse 41 of the inverted clock signal of FIG. 2B, the output $X_1$ of signal conversion circuit 10 is not determinable as is best illustrated by the cross hatching of FIG. 2E.

The rising edge of the clock pulse 47 of the clock signal of FIG. 2A clocks data bit 42 (FIG. 2C) through Flip-Flop 12 to its Q output. This results in data bit 42 which is a logic zero being supplied to inverters 14 and 28 and the first inputs of AND gate 20 and NAND gate 26. Inverter 14 inverts data bit 42 to a logic one enabling AND gate 16. When the inverted clock signal of FIG. 2B again transitions to the logic one state (illustrated as clock pulse 49) the output of AND gate 16 will transition to the logic one state resulting in a logic one being provided to the first input of OR gate 38. This causes the output of OR gate 38 to transition to a logic one state which results in the occurrence of data bit 51 of the Bi-Phase data stream of FIG. 2E at the $X_1$ output of OR gate 38.

Since data bit 42 (FIG. 2C) was provided to the first input of NAND gate 26, the output of NAND gate 26 will be at the logic one state resulting in a logic one being supplied to the D input of Flip-Flop 34. Since data bit 42 (FIG. 2C) was also provided to inverter 28 AND gate 30 is enabled. When the NRZ-L data stream of FIG. 2C transitions to the logic one state (data bit 55) the output of AND gate 30 will transition to the logic one state resulting in a logic one being supplied to the D input of Flip-Flop 36.

The rising edge of clock pulse 49 (FIG. 2B) will clock the logic one at the D input of Flip-Flop 34 to its Q output enabling AND gate 22. The rising edge of clock pulse 49 (FIG. 2B) will also clock the logic one at the D input of Flip-Flop 34 to its Q output resulting in a logic one being supplied to the third input of OR gate 38.

Since data bit 42 was supplied to the first input of AND gate 20 the output of AND gate 20 will be at the logic zero state which results in a logic zero being provided to the second input of AND gate 22. This, in turn, results in a logic zero at the output of AND gate 22 which is provided to the second input of OR gate 38.

The rising edge of the clock pulse 53 of the clock signal of FIG. 2A clocks data bit 55 (FIG. 2C) through Flip-Flop 12 to its Q output. This results in data bit 55 which is a logic one being supplied to inverters 14 and 28 and the first inputs of AND gate 20 and NAND gate 26. Inverter 14 inverts data bit 55 to a logic zero disabling AND gate 16. AND gate 20 is enabled by data bit 55.

Inverter 28 also inverts data bit 55 to a logic zero disabling AND gate 30. This results in a logic zero being provided to the D input of Flip-Flop 36.

At this time it should be noted that for each clock cycle of the clock signal of FIG. 2A, one NRZ-L data bit is supplied to the DATA input of signal conversion circuit 10. Thus, as can be seen in the waveform of FIG. 2C two logic one NRZ-L data bits 55 and 56 follow the logic zero NRZ-L data bit 42.

Since the NRZ-L data stream of FIG. 2C remains at the logic one state (both data bits 55 and 56 are logic ones), inverter 24 will provide a logic zero to the second input NAND gate 26 resulting in a logic one at the output of NAND gate 26 which is supplied to then supplied to the D input of Flip-Flop 34.

The rising edge of clock pulse 57 (FIG. 2B) will clock the logic one at the D input of Flip-Flop 34 to its Q output and the logic zero at the D inputs of Flip-Flop 36 to its Q output. The logic one occurring at the Q output of Flip-Flop 34 is supplied to AND gate 22 enabling AND gate 22. However, the output of AND gate 20 is a zero since the clock signal of FIG. 2A is at the logic zero state resulting in a logic zero at the output of AND gate 22 which is then supplied to the second input of OR gate 22. The logic zero occurring at the Q output of Flip-Flop 36 is supplied to the third input of OR gate 38. Since AND gate 16 is already disabled resulting in a logic zero at the first input of OR gate 38, the $X_1$ output of circuit 10 will transition from logic one state (data bit 51 of FIG. 2E) to the logic zero state (bit 59 of FIG. 2E).

The rising edge of clock pulse 61 of the clock signal of FIG. 2A clocks data bit 56 (FIG. 2C) through Flip-Flop 12 to its Q output. This results in data bit 56 which is a logic one being supplied to inverters 14 and 28 and the first inputs of AND gate 20 and NAND gate 26. AND gate 16 is disabled by the inversion of data bit 56 resulting in a logic zero being supplied to the first input of OR gate 38.

Since the Q output of Flip-Flop 34 is still at the logic one state AND gate 22 is still enabled. With the transition of clock pulse 61 to the logic one state the output of AND gate 20 will transition to the logic one state resulting in a logic one being supplied through AND gate 22 to the second input of OR gate 38. The $X_1$ output of OR gate 38 will now transition to the logic one state. This transition of the waveform of FIG. 2E from a logic zero state to a logic one pulse 63 illustrates the imbedding of the clock pulse 61 of the clock signal of FIG. 2A into the data stream of FIG. 2E.

It should be noted that the signal conversion circuit 10 of FIG. 1 eliminates any spikes of the type illustrated in FIG. 2D (the prior art method of Bi-Phase data stream) from the Bi-Phase data stream of FIG. 2E. It should also be noted that there is one clock cycle delay between the Bi-Phase data stream of FIG. 2D and the Bi-Phase data stream of FIG. 2E.

From the foregoing, it may readily be seen that the present invention comprises a new, unique and exceedingly useful digital conversion circuit for converting incoming NRZ-L data to Bi-Phase data which constitutes a considerable improvement over the known prior art. Obviously many modifications of the present invention are possible in light of the above teachings. It is therefore to be understood that within the scope of the appended claims the invention may be practiced otherwise than as specifically described.

What is claimed is:

1. A signal conversion circuit for converting a first data stream to a second data stream and eliminating voltage spikes from said second data stream, said signal conversion circuit comprising:

first latching means for receiving an external clock signal, said first latching means having a data input for receiving said first data stream, said first latching means storing one data bit of a plurality of data bits of said first data stream therein for one clock cycle of said external clock signal;

detecting means coupled to said first latching means for comparing the one data bit stored in said first latching means with another data bit being received next sequentially at the data input of said first latching means;

said detecting means generating a change of state logic signal whenever the one data bit stored in said first latching means has a different logic state from the another data bit being received at the data input of said first latching means;

inverting means for inverting said external clock signal to provide an inverted clock signal;

second latching means coupled to said inverting means and said detecting means, said second latching means responsive to said inverted clock signal storing therein said change of state logic signal; and EXCLUSIVE-NOR circuit means for receiving said external clock signal, said EXCLUSIVE-NOR circuit means being coupled to said first latching means, said second latching means and said detecting means;

said EXCLUSIVE-NOR circuit means converting said first data stream to said second data stream and imbedding said external clock signal into said second data stream, said EXCLUSIVE-NOR circuit means responsive to said change of state signal, eliminating said voltage spikes from said second data stream.

2. The digital signal conversion circuit of claim 1 wherein said detecting means comprises:

a first inverter having input for receiving said first data stream and an output;

a NAND gate having a first input connected to said first latching means, a second input connected to the output of said first inverter and an output connected to said second latching means;

a second inverter having an input connected to said first latching means and output; and an AND gate having a first input connected to the output of said second inverter, a second input for receiving said first data stream and an output connected to said second latching means.

3. The digital signal conversion circuit of claim 1 wherein said EXCLUSIVE-NOR circuit means comprises:

a first inverter having an input connected to said first latching means and an output;

a second inverter having an input for receiving said external clock signal and an output;

a first AND gate having a first input connected to the output of said first inverter, a second input connected to the output of said second inverter and an output;

a second AND gate having a first input connected to said first latching means, a second input for receiving said external clock signal and an output;

a third AND gate having a first input connected to the output of said second AND gate, a second input connected to said second latching means and an output; and an OR gate having a first input connected to the output of said first AND gate, a second input connected to the output of said third AND gate, a third input connected to said second latching means and an output for providing said second data stream.

4. The signal conversion circuit of claim 1 wherein said first latching means comprises a D-type Flip-Flop.

5. The signal conversion circuit of claim 1 wherein said second latching means comprises a pair of D-type Flip-Flops.

6. The signal conversion circuit of claim 1 wherein said first data stream comprises a Non-Return to Zero Level Data stream.

7. The signal conversion circuit of claim 1 wherein said second data stream comprises a Bi-Phase Data stream.

8. A signal conversion circuit for converting a first data stream to a second data stream comprising:

a first Flip-Flop having a data input for receiving said first data stream, a clock input for receiving a clock signal and a Q output;

a first inverter having an input connected to the Q output of said first Flip-Flop and an output;

a second inverter having an input for receiving said clock signal and an output;

a first AND gate having a first input connected to the output of said first inverter, a second input connected to the output of said second inverter and an output;

a second AND gate having a first input connected to the Q output of said first Flip-Flop, a second input for receiving said clock signal and an output;

a third inverter having an input for receiving said first data stream and an output;

a NAND gate having a first input connected to the Q output of said first Flip-Flop, a second input connected to the output of said third inverter and an output;

a fourth inverter having an input connected to the Q output of said first Flip-Flop and an output;

a third AND gate having a first input connected to the output of said fourth inverter, a second input for receiving said first data stream and an output;

a fifth inverter having an input for receiving said first data stream and an output;

a second Flip-Flop having a data input connected to the output of said NAND gate, a clock input connected to the output of said fifth inverter and a Q output;

a third Flip-Flop having a data input connected to the output of said third AND gate, a clock input connected to the output of said fifth inverter and a Q output;

a fourth AND gate having a first input connected to the output of said second AND gate, a second input connected to the Q output of said second Flip-Flop and an output; and an OR gate having a first input connected to the output of said first AND gate, a second input connected to the output of said fourth AND gate, a third input connected to the Q output of said third Flip-Flop and an output for providing said second data stream.

9. The signal conversion circuit of claim 8 wherein said first data stream comprises a Non-Return to Zero Level Data stream.

10. The signal conversion circuit of claim 8 wherein said second data stream comprises a Bi-Phase Data stream.

* * * * *